United States Patent [19]

Flükiger

[11] Patent Number: 5,075,285

[45] Date of Patent: Dec. 24, 1991

[54] SILVER ALLOY SHEATHING MATERIAL FOR CERAMIC SUPERCONDUCTING WIRES

[75] Inventor: René Flükiger, Karlsruhe, Fed. Rep. of Germany

[73] Assignee: Kernforschungszentrum Karlsruhe GmbH, Karlsruhe, Fed. Rep. of Germany

[21] Appl. No.: 363,897

[22] PCT Filed: Sep. 2, 1988

[86] PCT No.: PCT/DE88/00544

§ 371 Date: May 17, 1989

§ 102(e) Date: May 17, 1989

[87] PCT Pub. No.: WO89/02656

PCT Pub. Date: Mar. 23, 1989

[30] Foreign Application Priority Data

Sep. 17, 1987 [DE] Fed. Rep. of Germany ....... 3731266

[51] Int. Cl.$^5$ ..................... H01B 39/14; H01B 12/00
[52] U.S. Cl. ......................................... 505/1; 29/599;
420/503; 428/930; 505/704; 505/740; 505/781
[58] Field of Search .................. 428/930; 420/503;
505/1, 704, 740, 781; 29/599

[56] References Cited

U.S. PATENT DOCUMENTS

| | | | |
|---|---|---|---|
| 3,254,279 | 5/1966 | Cohn et al. | 420/505 |
| 3,661,569 | 5/1972 | Abbott | 420/505 |
| 3,702,763 | 11/1972 | Gamer et al. | 420/505 |
| 4,078,299 | 3/1978 | Furuto et al. | 148/11.5 R |
| 4,990,490 | 2/1991 | Pathare et al. | 505/1 |

FOREIGN PATENT DOCUMENTS

| | | | |
|---|---|---|---|
| 0281474 | 7/1988 | European Pat. Off. | 29/599 |
| 0312015 | 4/1989 | European Pat. Off. | 428/930 |
| 0284720 | 11/1988 | Japan | 505/704 |
| 0003909 | 1/1989 | Japan | 505/704 |
| 0134821 | 5/1989 | Japan | 29/599 |
| 0163915 | 6/1989 | Japan | 505/740 |

OTHER PUBLICATIONS

Jin et al., Appl. Phys. Letts. 51 (Jul. 20, 1987) 203-4.
Dubots et al. in Europ. Workshop ... High Tc Superconductors ..., Jul. 1-3, 1987, pp. 133-135.
Tachikawa et al, Proc. IEEE, 77 (Aug. 1989) 1124.

*Primary Examiner*—Upendra Roy
*Attorney, Agent, or Firm*—Spencer & Frank

[57] ABSTRACT

The invention relates to a sheathing material for superconducting wires which are deformed during manufacture by drawing or a similar procedure. The superconducting material of the wires is composed of an oxide whose superconducting properties worsen during the deformation so that, in order to recover its original superconducting properties or to further improve them, the material must be subjected to a recovery heat treatment at temperatures above 940° C.

Customarily, silver is employed as the sheathing material for such wires. The recovery heat treatment is generally performed at temperatures around 900° C. Experiments have shown that the optimum temperature range for a recovery heat treatment lies between about 940° C. and 1030° C. However, these temperatures were above the melting temperature of silver in an oxygen atmosphere. It is the object of the invention to find a sheathing material which has the favorable properties of silver but melts only at a temperature above the optimum temperature for the recovery heat treatment.

This is accomplished according to the invention in that the sheathing material employed is a silver alloy whose melting point lies above the melting point of pure silver.

5 Claims, No Drawings

SILVER ALLOY SHEATHING MATERIAL FOR CERAMIC SUPERCONDUCTING WIRES

FIELD OF THE INVENTION

The invention relates to a sheathing material for superconducting wires according to the preamble of claim 1.

Technology Review

In technologically usable superconducting wires, the superconducting oxide must be surrounded by a metal sheath. This metallic sheathing material performs several important tasks.

One function of the sheathing material is to minimize heating as the result of local losses of the superconducting property of the oxide and thus contributes to the retention of the superconductive property of the entire unit when the transition temperature is exceeded. Another function of the sheathing is to support the brittle superconducting oxide against the usually unavoidable mechanical stresses which occur during its manufacture and also as a result of the Lorentz force during operation of a superconductor.

Moreover, the sheathing material must be able to air-tightly seal the superconducting core against the atmosphere at temperatures below 300° K. so that its oxygen content remains unchanged during storage as well as during operation.

All prior art high field superconductors at $B_{c2} > 15$ Tesla are distinguished by extraordinary brittleness. This property quite significantly influences the manufacturing process for wires. Wires containing high field superconductors such as $YBa_2Cu_3O_7$ or oxides derived from it (substitution of Y by rare earths) can at present be manufactured only by powder technology methods.

In this case, the already formed (pre-reacted) superconducting phase is filled into a metal tube, is compressed and shaped by deformation processes such as hammering, rolling or drawing into a thin wire having a diameter of about 1 mm.

It is not yet known how the deformation process takes place in detail within the superconducting phase, but it has been possible to detect the results of the deformation by measuring the transition temperature $T_c$ and the critical current density $J_c$.

Although for $YBa_2Cu_3O_7$ and oxides derived therefrom $T_c$ remains constant, the percentage of the superconducting phase and the critical current density $J_c$ decrease with increasing degree of deformation. The superconducting properties disappear completely if the deformation is extensive. To recover the original superconducting properties at a later time, recovery heat treatments are necessary which are customarily performed at temperatures above 800° C., frequently at about 900° C. to a maximum of 940° C., which is followed by an oxidation heat treatment.

In the past, the sheathing material for the production of high field superconducting wires has almost exclusively been pure silver (Proc. 1. European Workshop on High $T_c$ Superconductors and Potential Applications, P. Dubots et al, page 133; G. Barani et al, page 137; R. Flükiger et al, page 131; and S. Jin et al, Appl. Phys. Lett. 51 (1987), page 203).

Pure silver is well suited for this purpose for several reasons. It is ductile, its melting point in air lies at 960.8° C. and in a pure oxygen atmosphere at 939° C.; it does not undergo a reaction with the oxidic superconductor if it is heat treated and finally it is permeable to oxygen at temperatures above 400° C. From an economic point of view, the price of silver is considered to be still acceptable for the intended purpose.

Although Jin et al propose a sheathing material of copper including a diffusion barrier of nickel/gold, copper is less suitable due to its irreversible formation of copper oxide.

For a superconductor of the $YBa_2Cu_3O_7$ type, the above mentioned recovery heat treatment is usually performed at temperatures barely below the melting point of silver in an oxygen atmosphere. This recovery heat treatment is then followed by an oxidation heat treatment at about 400° C. to 700° C. at which the oxygen loss in the oxidic superconducting material $YBa_2Cu_3O_7$—which is about 2% at 900° C.—is replaced again.

SUMMARY OF THE INVENTION

Our tests have shown that the critical current density of superconducting $YBa_2Cu_3O_7$ wires can be increased substantially if the recovery heat treatment is not performed at 900° C., with a maximum at 939° C., but at temperatures in a range between 940° C. and 1030° C., that is, in a temperature range in which silver already melts in an oxygen atmosphere.

It is thus an object of the invention to provide sheathing material for superconducting wires which has at least the same, above-mentioned, favorable properties as silver but which melts at a higher temperature so that, with this sheathing material, the recovery heat treatment can be performed in the optimum temperature range at temperatures higher than 940° C. up to 1030° C.

The cost of this sheathing material does not significantly exceed the price of silver.

The silver alloy employed as the inventions sheathing material has melting point above the melting point of pure silver. Such a silver alloy can be produced by alloying at least one of the elements from the group including gold, palladium, platinum, manganese and titanium with silver.

DESCRIPTION OF THE PREFERRED EMBODIMENTS

The following table gives examples of silver alloys within the scope of the invention which have a melting point of at least 1000° C.

TABLE

| Alloy | Composition* | Melting Point |
| --- | --- | --- |
| Ag—Au | 35 weight % Au | 1000° C. |
| Ag—Mn | 23 weight % Mn | 1000° C. |
|  | 31 weight % Mn | 1071° C. |
| Ag—Pd | 10 weight % Pd | 1000° C. |
|  | 20 weight % Pd | 1070° C. |
| Ag—Pt | 20 weight % Pt | 1000° C. |
|  | 35 weight % Pt | 1050° C. |
| Ag—Ti | 3 weight % Ti | 1017° C. |

*Difference compared to 100 weight % Ag

The above listed favorable properties of pure silver are not negatively influenced by the admixture of an alloying component from the above-mentioned group.

As indicated by the examples listed below, a higher recovery heat treatment temperature considerably increase the value of the critical current density $J_c$. However, the recovery heat treatment temperature can only be raised to values above the previously employed temperature of about 900° C., with a maximum at 939° C., if a sheathing material is employed which has the favorable properties of silver but whose melting point is higher than the temperature at which the recovery heat treatment must be performed in order to obtain optimum results.

The invention will now be described in greater detail with reference to production examples.

EXAMPLE 1

A superconducting wire was produced by drawing of a tube (12×1.5 mm) composed of a silver-palladium alloy containing 8 weight percent Pd and filled with $YBa_2Cu_3O_7$ powder. After drawing, the sheathing material had an external diameter of 1.15 mm and an internal diameter of 0.85 mm.

The recovery heat treatment was performed at a temperature of 970° C. for a heat treatment duration of 80 minutes. Then an oxidation heat treatment was performed in which a temperature of 680° C. was maintained for six hours and a temperature of 550° C. was maintained for 48 hours. Both heat treatments were performed in an oxygen atmosphere. The superconducting wire produced in this manner attained a critical current density of 450 A cm$^2$ (with reference to its cross-section). This value is noticeably higher than that of $J_c$=175 A/cm$^2$ published by Jin et al which was realized with a sheathing material made of silver and recovery and oxidation heat treatment temperatures of 900° C. and 600° C., respectively.

EXAMPLE 2

A superconducting wire was produced by drawing a tube (12×1 mm) made of a silver-palladium alloy containing 20 weight percent Pd and filled with $YBa_2Cu_3O_7$ powder. After drawing, the sheathing material had an external diameter of 0.4 mm and a wall thickness of 0.03 mm.

The recovery heat treatment was performed at a temperature of 990° C. for a heat treatment duration of 75 minutes. Then an oxidation heat treatment was performed at three different temperature stages:
1. 6 hours at 680° C;
2. 24 hours at 550° C.;
3. 48 hours at 450° C.

Both heat treatments were performed in an oxygen atmosphere.

The superconducting wire produced in this way attained a critical current density of 680 A/Cm$^2$ (with reference to its cross section).

Other modifications and variation of the present invention are possible in light of the above teachings. It is, therefore, to be understood that changes may be made in the particular embodiments described above which are within the full intended scope of the invention as defined in the appended claims.

I claim:

1. A sheathing material for superconducting wires which are deformed during production by drawing or a similar process, and which are made of a superconducting material comprising an oxide having superconducting properties which worsen during deformation and which must be subjected, in order to recover said superconducting properties or to improve said superconducting properties, to a recovery heat treatment before a later oxidation heat treatment, wherein said sheathing material comprises
a silver alloy having a melting point above the melting point of pure silver.

2. Sheathing material according to claim 1, wherein said silver alloy comprises silver alloyed with at least one of the elements selected from the group consisting of gold, palladium, platinum, manganese and titanium.

3. Sheathing material according to claim 2, wherein the concentration of the elements alloyed in said silver alloy is selected so that the melting point of said sheathing material is above the optimum temperature for a recovery heat treatment.

4. A superconductor comprising:
a sheathing material for superconducting wires which are deformed during production by drawing or a similar process, and which are made of a superconducting material comprising an oxide having superconducting properties which worsen during deformation and which must be subjected, in order to recover said superconducting properties or to improve said superconducting properties, to a recovery heat treatment before a later oxidation heat treatment, said sheathing material having an interior and comprising a silver alloy having a melting point above the melting point of pure silver; and
a superconductive material disposed in said interior of said sheathing material, said superconductive material and said sheathing material being jointly deformed, and then being jointly subjected to a recovery heat treatment so that said superconducting properties are recovered.

5. A superconductor as defined in claim 4, wherein said superconductive material comprises a powdered oxide.

* * * * *